(12) United States Patent
Lim et al.

(10) Patent No.: US 8,686,295 B2
(45) Date of Patent: Apr. 1, 2014

(54) HEAT-DISSIPATING SUBSTRATE AND FABRICATING METHOD THEREOF

(75) Inventors: Chang Hyun Lim, Seoul (KR); Seog Moon Choi, Seoul (KR); Sang Hyun Shin, Gyunggi-do (KR); Young Ki Lee, Gyunggi-do (KR); Sung Keun Park, Gyunggi-do (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 567 days.

(21) Appl. No.: 12/614,407

(22) Filed: Nov. 7, 2009

(65) Prior Publication Data

US 2011/0061901 A1    Mar. 17, 2011

(51) Int. Cl.
*H05K 1/00* (2006.01)
*H05K 1/03* (2006.01)
*H05K 1/09* (2006.01)
*H05K 7/20* (2006.01)

(52) U.S. Cl.
USPC .......................... 174/252; 174/256; 361/713

(58) Field of Classification Search
USPC .......... 174/252, 255, 256, 258; 361/706, 713, 361/709
See application file for complete search history.

(56) References Cited

U.S. PATENT DOCUMENTS

| 3,939,047 | A | * | 2/1976 | Tsunemitsu et al. | 257/763 |
| 5,155,299 | A | * | 10/1992 | Mahulikar et al. | 174/536 |
| 5,305,186 | A | * | 4/1994 | Appelt et al. | 257/713 |
| 5,533,257 | A | * | 7/1996 | Romero et al. | 257/E23.103 |
| 2006/0056213 | A1 | * | 3/2006 | Lee et al. | 363/144 |
| 2006/0145340 | A1 | * | 7/2006 | Tseng et al. | 257/724 |
| 2007/0221928 | A1 | * | 9/2007 | Lee et al. | 257/79 |

FOREIGN PATENT DOCUMENTS

| JP | 2004179291 A | * | 6/2004 | H05K 1/05 |
| JP | 2004214583 A | * | 7/2004 | H05K 1/16 |

OTHER PUBLICATIONS

English Maqchine Translations provided for JP 2004179291 A and JP 2004214583 A.*

* cited by examiner

*Primary Examiner* — Chau Nguyen
*Assistant Examiner* — Roshn Varghese
(74) *Attorney, Agent, or Firm* — Bracewell & Giuliani LLP (57) ABSTRACT

Disclosed herein are a heat-dissipating substrate and a fabricating method thereof. The heat-dissipating substrate includes a plating layer divided by a first insulator formed in a division area. A metal plate is formed on an upper surface of the plating layer and filled with a second insulator at a position corresponding to the division area, with an anodized layer formed on a surface of the metal plate. A circuit layer is formed on the anodized layer which is formed on an upper surface of the metal plate. The heat-dissipating substrate and fabricating method thereof achieves thermal isolation by a first insulator formed in a division area and a second insulator.

9 Claims, 9 Drawing Sheets

FIG.1

Prior art

FIG.2

Prior art

FIG.3

Prior art

FIG.4

Prior art

FIG.5

Prior art

FIG.6

Prior art

HEAT-DISSIPATING SUBSTRATE AND FABRICATING METHOD THEREOF

CROSS REFERENCE TO RELATED APPLICATION

This application claims the benefit of Korean Patent Application No. 10-2009-0086997, filed on Sep. 15, 2009, entitled "Heat-Dissipating Substrate And Fabricating Method Of The Same", which is hereby incorporated by reference in its entirety into this application.

BACKGROUND OF THE INVENTION

1. Technical Field

The present invention relates to a heat-dissipating substrate and a fabricating method thereof.

2. Description of the Related Art

Today, as electronic parts are seeking miniaturization, thinness, and high density and as such become light, thin, short and small, the miniaturization, micro patterning and packaging of a Printed Circuit Board (PCB) are being carried out with these things being taken into consideration. Thus, the PCB is more complicated in structure and the mounting density of parts is increased.

However, as the number and density of electronic parts mounted on the PCB increase, measures are required to provide for the dissipation of heat generated from the electronic parts and to prevent warpage.

In order to solve the problems presented by heat dissipation and warpage, a variety of types of package substrates have been proposed. However, the package substrate may be deformed because of residual stress resulting from a difference in a thermal expansion coefficient between a semiconductor chip, underfill and a substrate and a thermal cycle during a fabrication process. Thus, a structure for minimizing deformation using a metal core which is low in thermal expansion coefficient and for solving the problems of warpage and heat dissipation has been proposed.

FIGS. 1 to 5 are sectional views illustrating a conventional fabricating method of a PCB using a metal core. The fabricating method will be described with reference to the accompanying drawings.

Figure 1:
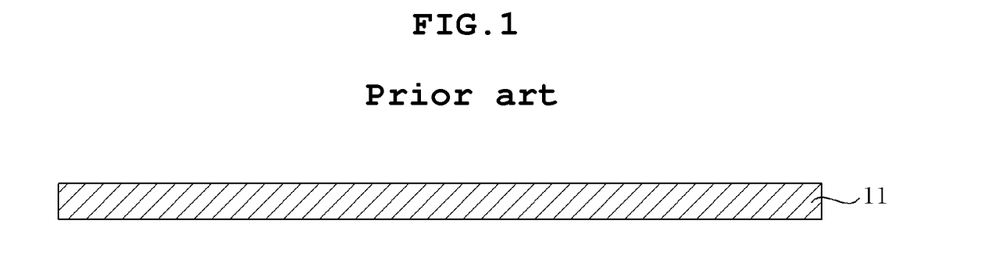
FIGS. 1 to 5 are sectional views illustrating a conventional fabricating method of a PCB using a metal core.

First, a metal core 11 having high heat conductivity is prepared (see FIG. 1).

Figure 2:
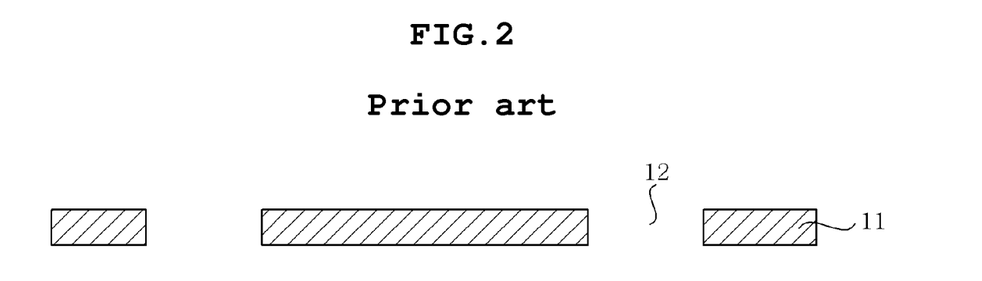

Next, through holes 12 are formed in the metal core 11 through drilling or etching (see FIG. 2).

Figure 3:
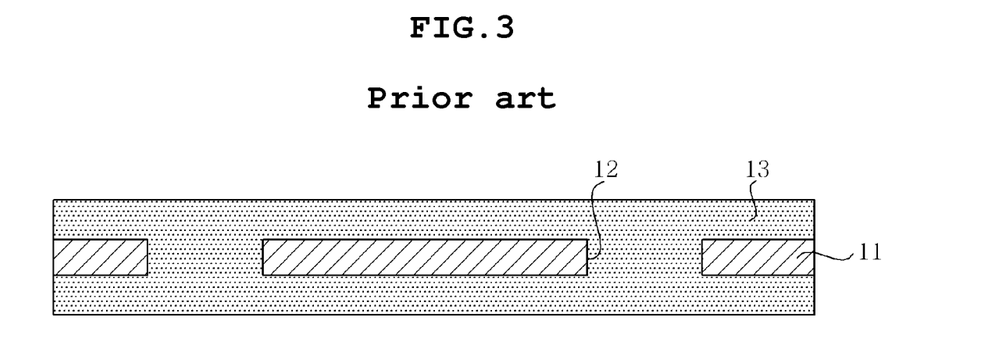
Figure 4:
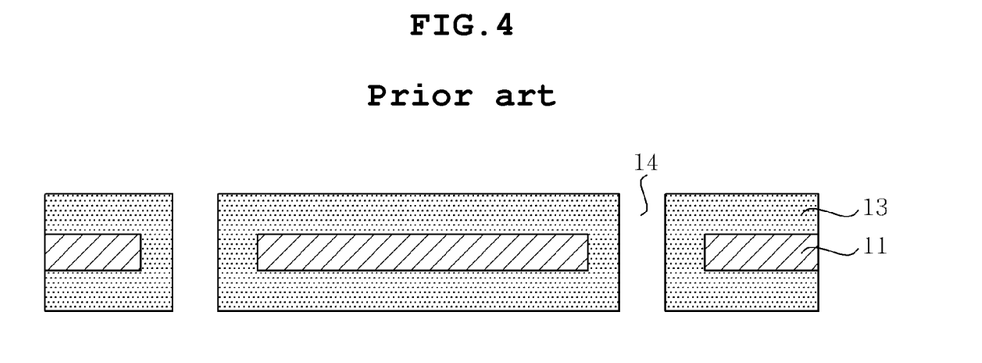

Subsequently, insulating layers 13 are formed on both sides of the metal core 11 including the through holes 12 (see FIG. 3).

Next, for layer-by-layer connection, the through holes 12 of the metal core 11 are mechanically machined, thus forming via holes 14. Here, the via holes 14 are machined to be smaller than the through holes 12 of the metal core 11 to be insulated from a copper plating layer formed on the inner wall of each via hole 14 through a subsequent copper plating process (see FIG. 4).

Figure 5:
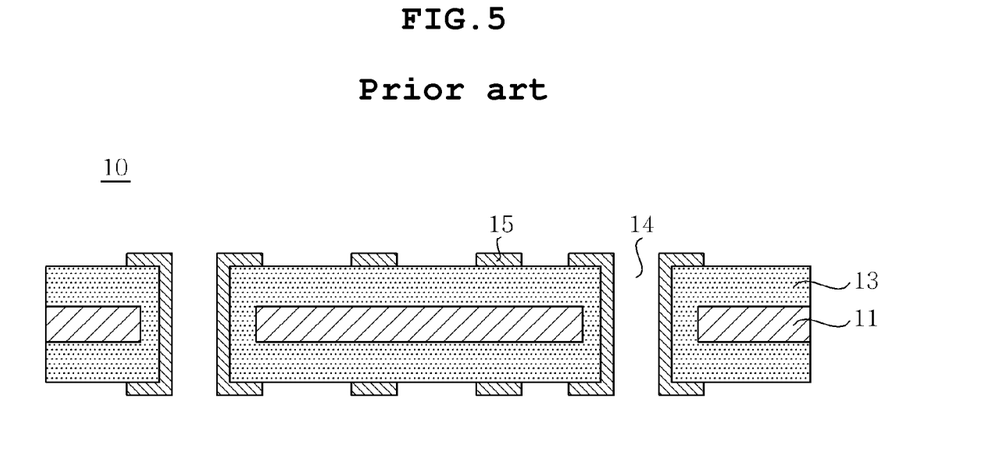

Thereafter, the copper plating layer is formed on the surface of each insulating layer 13 and the inner wall of each via hole 14 through chemical copper plating, that is, electroless plating and electrolytic plating. Through exposing, developing and etching processes, circuit layers 15 are formed. In this way, a PCB 10 is fabricated.

However, the conventional fabricating method of the metal core heat-dissipating substrate 10 has the following problems.

First, in order to prevent electric failure due to a short occurring in the plating layer formed on the metal core 11 and the inner wall of each via hole 14, the through holes 12 must be machined to a sufficient size. In this case, the ratio of the remaining metal core for a substrate area is only about 50%, so that heat conductivity is reduced.

In order to increase heat dissipation efficiency, the metal core 11 is inserted. However, this increases the overall thickness of the substrate. Since the insulating layer 13 such as a prepreg which is very low in heat conductivity is used, the heat conducting effect of the metal core is deteriorated.

Figure 6:
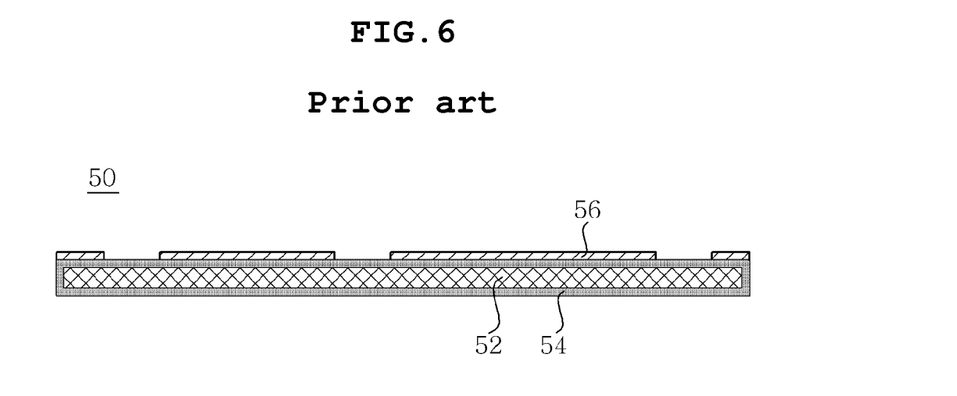
FIG. 6 is a sectional view illustrating a conventional anodized metal substrate.

In order to solve the problems, the structure of an anodized metal substrate 50 shown in FIG. 6 has been proposed. According to this structure, an anodized layer 54 is formed on a surface of the metal plate 52, and a circuit layer 56 is formed on the anodized layer 54.

The anodized metal substrate 50 is superior to the metal core heat-dissipating substrate 10 in heat dissipation performance. However, the anodized metal substrate 50 is problematic in that, when a device susceptible to heat is mounted on the circuit layer 56, heat conduction is performed and thermal isolation is not performed, so that the device susceptible to heat may be damaged.

SUMMARY OF THE INVENTION

The present invention is intended to provide a heat-dissipation substrate which enables thermal isolation and a method of fabricating the heat-dissipation substrate.

In an exemplary heat-dissipation substrate according to an embodiment of the present invention, a plating layer is divided by a first insulator formed in a division area. A metal plate is formed on an upper surface of the plating layer and filled with a second insulator at a position corresponding to the division area, with an anodized layer formed on a surface of the metal plate. A circuit layer is formed on the anodized layer which is formed on an upper surface of the metal plate.

The anodized layer formed on a lower surface of the metal plate may be provided between the first insulator and the second insulator.

Further, the first insulator and the second insulator may be formed to contact each other.

The metal plate may be made of aluminum or aluminum alloy, and the anodized layer may comprise an aluminum anodized layer.

Further, a groove may be formed in the plating layer.

The plating layer may form an open part therein to have a circuit pattern, and the circuit pattern may be electrically connected to the circuit layer through a via hole which is formed through the metal plate.

Further, a through hole may be formed in the metal plate, and the anodized layer may be formed on the metal plate including an inner wall of the through hole, and the via hole may be formed in the through hole to be connected to the circuit layer.

The open part may be filled with a third insulator.

In an exemplary fabricating method of a heat-dissipating substrate according to an embodiment of the present invention, at (A), a plating layer, divided by a plating resist formed in a division area, is formed on a first surface of a metal plate on which an anodized layer is formed. At (B), the plating resist is removed from the division area, and the division area is filled with a first insulator. At (C), a circuit layer is formed on the anodized layer which is formed on a second surface of the metal plate. At (D), the metal plate is removed from an upper portion of the division area, the anodized layer is removed from the second surface of the metal plate, and removed parts are filled with a second insulator.

At (D), the anodized layer may be removed from the first surface of the metal plate, and the second insulator may be filled to contact the first insulator.

Further, the metal plate may be made of aluminum or aluminum alloy, and the anodized layer may comprise an aluminum anodized layer.

Further, a groove may be formed in the plating layer.

The plating layer may form an open part therein to have a circuit pattern, and the circuit pattern may be electrically connected to the circuit layer through a via hole which is formed through the metal plate.

Further, a through hole may be formed in the metal plate, and the anodized layer may be formed on the metal plate including an inner wall of the through hole, and the via hole may be formed in the through hole to be connected to the circuit layer.

The open part may be filled with a third insulator.

BRIEF DESCRIPTION OF THE DRAWINGS

FIGS. 12A and 12B through 16A and 16B are sectional views and plan views illustrating the fabricating method of the heat-dissipating substrate according to a preferred embodiment of the present invention in sequence.

DESCRIPTION OF THE PREFERRED EMBODIMENTS

Various objects, advantages and features of the invention will become apparent from the following description of embodiments with reference to the accompanying drawings.

The terms and words used in the present specification and claims should not be interpreted as being limited to typical meanings or dictionary definitions, but should be interpreted as having meanings and concepts relevant to the technical scope of the present invention based on the rule according to which an inventor can appropriately define the concept of the terms to describe most appropriately the best method he or she knows for carrying out the invention.

The above and other objects, features and advantages of the present invention will be more clearly understood from the following detailed description taken in conjunction with the accompanying drawings. Herein, the same reference numerals are used throughout the different drawings to designate the same components. Further, when it is determined that the detailed description of the known art related to the present invention might obscure the gist of the present invention, the detailed description thereof will be omitted.

Hereinafter, the preferred embodiments of the present invention will be described in detail with reference to the accompanying drawings.

Structure of Heat-Dissipating Substrate—First Embodiment

Figure 7A:
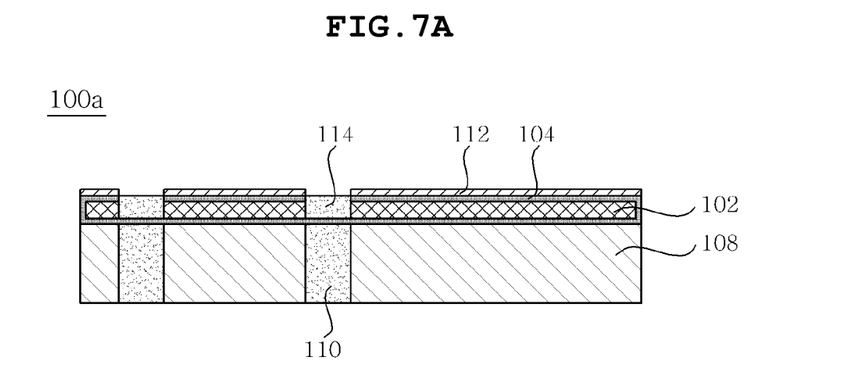
FIGS. 7A and 7B are a sectional view and a plan view illustrating a heat-dissipating substrate according to a preferred first embodiment of the present invention.
Figure 7B:
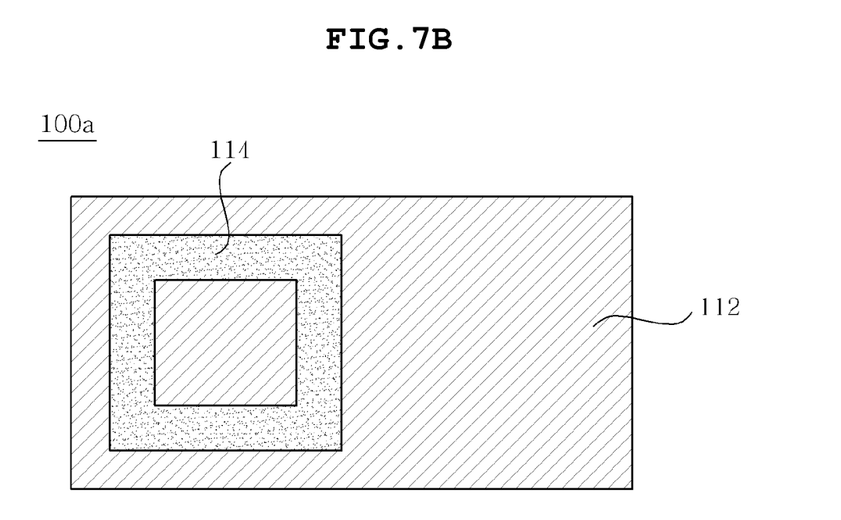

FIGS. 7A and 7B are a sectional view and a plan view illustrating a heat-dissipating substrate according to a preferred first embodiment of the present invention. Hereinafter, a heat-dissipating substrate 100a according to this embodiment will be described with reference to the drawings.

As shown in FIGS. 7A and 7B, the heat-dissipating substrate 100a according to this embodiment has an anodized metal substrate which is provided on the upper surface of a plating layer 108 divided by a first insulator 110 and is divided by a second insulator 114 formed at a position corresponding to that of the first insulator 110.

The plating layer 108 is formed on the lower surface of the anodized metal substrate and is divided by the first insulator 110 which is provided in the plating layer 108 to form a division area. In detail, the plating layer 108 formed inside the first insulator 110 is thermally isolated from the plating layer 108 formed outside the first insulator 110 by the first insulator 110. Here, the first insulator 110 is an insulating material having low heat conductivity, and serves to prevent thermal flow between plating layers 108.

The anodized metal substrate is configured such that an anodized layer 104 is formed on a surface of a metal plate 102 and a circuit layer 112 is formed on the anodized layer 104. The second insulator 114 is formed in the metal plate 102 at a position corresponding to that of the first insulator 110, so that the metal plate 102 is divided. In detail, the metal plate 102 positioned above the first insulator 110 and the anodized layer 104 formed on the upper surface of the metal plate 102 are eliminated. The eliminated portion is filled with the second insulator 114, so that the circuit layer 112 and the metal plate 102 provided inside the second insulator 114 are thermally isolated from the circuit layer 112 and the metal plate 102 provided outside the second insulator 114. That is, when electronic devices are mounted on the circuit layer 112, a device resistant to heat and a device susceptible to heat may be separately provided inside and outside the second insulator 114. According to this embodiment, the anodized layer 104 is provided between the first insulator 110 and the second insulator 114.

Structure of Heat-Dissipating Substrate—Second Embodiment

Figure 8:
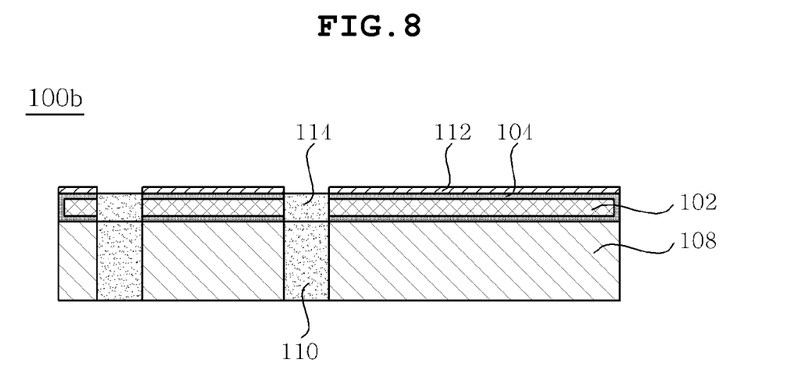
FIG. 8 is a sectional view illustrating a heat-dissipating substrate according to a preferred second embodiment of the present invention.

FIG. 8 is a sectional view illustrating a heat-dissipating substrate according to a preferred second embodiment of the present invention. Components common to both the embodiments will carry the same reference numerals.

As shown in FIG. 8, a heat-dissipating substrate 100b according to this embodiment is different from the heat-dissipating substrate 100a according to the first embodiment in that the anodized layer 104 between the first insulator 110 and the second insulator 114 is eliminated, so that the first insulator 110 is in contact with the second insulator 114. Since other parts of the second embodiment are equal to those of the first embodiment except for the above-mentioned difference, the duplicate description will be omitted herein.

According to this embodiment, the anodized layer 104 having the relatively high heat transfer characteristics of about 10 to 30 W/mK is removed from the division area and the second insulator 114 having low heat conductivity is filled. Such a structure achieves a higher thermal isolating function in comparison with the former embodiment.

Structure of Heat-Dissipating Substrate—Third Embodiment

Figure 9:
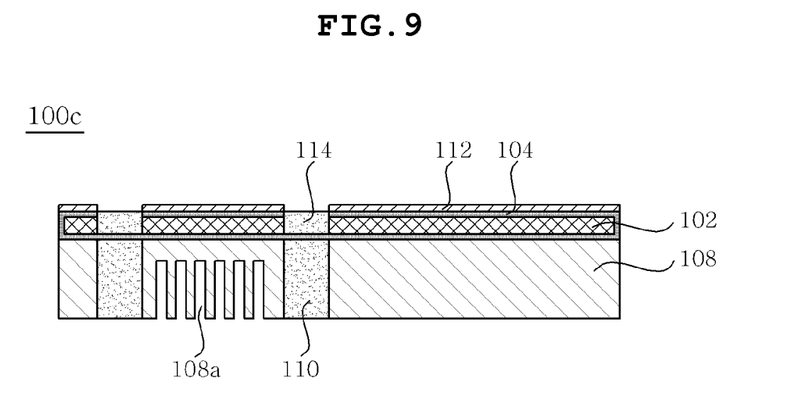
FIG. 9 is a sectional view illustrating a heat-dissipating substrate according to a preferred third embodiment of the present invention.

FIG. 9 is a sectional view illustrating a heat-dissipating substrate according to a preferred third embodiment of the present invention. Components common to the embodiments will carry the same reference numerals.

As shown in FIG. 9, a heat-dissipating substrate 100c according to this embodiment is different from the heat-dissipating substrate 100a according to the first embodiment in that grooves 108a are formed in a plating layer 108, so that the plating layer 108 has the structure of a radiative fin, thus improving heat dissipating performance. That is, the grooves 108a are formed in the plating layer 108 to increase a surface area, so that heat dissipating performance is superior to that of the first embodiment.

Meanwhile, the formation of the grooves 108a in the plating layer 108 of the heat-dissipating substrate 100b according to the second embodiment falls within the scope of the present invention.

Structure of Heat-Dissipating Substrate—Fourth Embodiment

Figure 10:
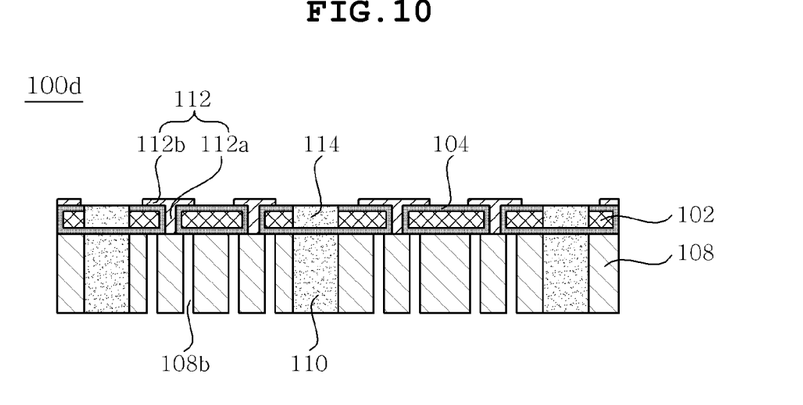
FIG. 10 is a sectional view illustrating a heat-dissipating substrate according to a preferred fourth embodiment of the present invention.

FIG. 10 is a sectional view illustrating a heat-dissipating substrate according to a preferred fourth embodiment of the present invention. Components common to the embodiments will carry the same reference numerals and the duplicate description will be omitted herein.

As shown in FIG. 10, a heat-dissipating substrate 100d according to this embodiment is constructed so that an open part 108b is formed in a plating layer 108 to form a circuit pattern, and a circuit layer 112 having a via hole 112a which is electrically connected to the plating layer 108 and a pattern part 112b is formed on a metal plate 102.

That is, according to this embodiment, the plating layer 108 is patterned to form the circuit pattern, thus realizing a structure wherein circuit layers are formed on both sides of the metal plate 102. Here, the plating layer 108 serves as both the circuit pattern and the heat dissipating member.

Structure of Heat-Dissipating Substrate—Fifth Embodiment

Figure 11:
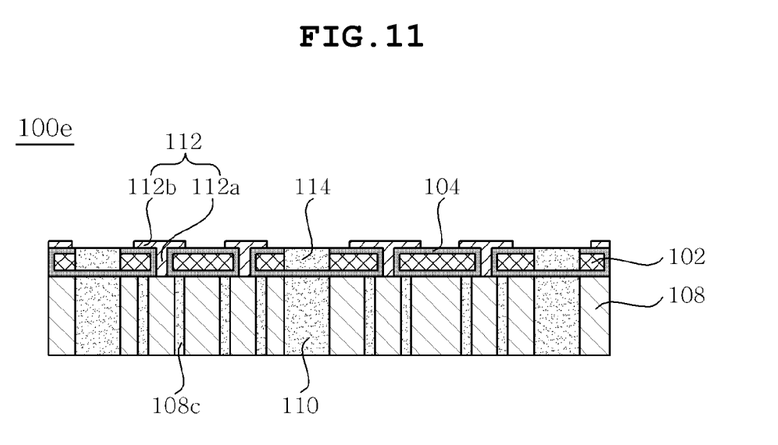
FIG. 11 is a sectional view illustrating a heat-dissipating substrate according to a preferred fifth embodiment of the present invention.

FIG. 11 is a sectional view illustrating a heat-dissipating substrate according to a preferred fifth embodiment of the present invention. Components common to the embodiments will carry the same reference numerals and the duplicate description will be omitted herein.

As shown in FIG. 11, a heat-dissipating substrate 100e according to this embodiment is constructed so that an open part 108b is filled with a third insulator 108c so as to improve the reliability of the heat-dissipating substrate 100d according to the fourth embodiment. Since other parts of the fifth embodiment are equal to those of the fourth embodiment except for the above-mentioned difference, the duplicate description will be omitted herein.

Fabricating method of Heat-Dissipating Substrate

FIGS. 12A and 12B through 16A and 16B are sectional views and plan views illustrating the fabricating method of the heat-dissipating substrate according to a preferred embodiment of the present invention in sequence. Hereinafter, the fabricating method of the heat-dissipating substrate according to this embodiment will be described with reference to the accompanying drawings.

Figure 12A:
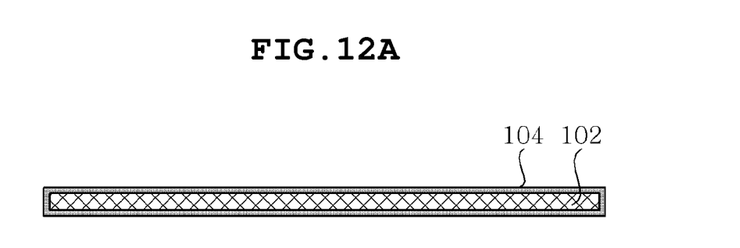
Figure 12B:
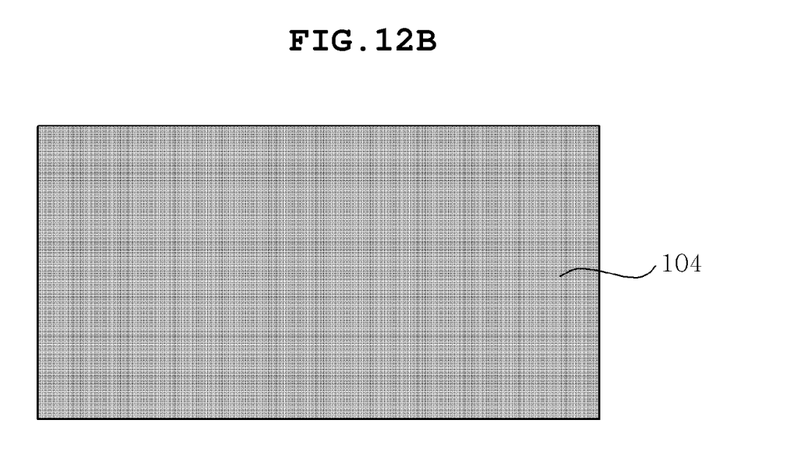

First, as shown in FIGS. 12A and 12B, the anodized layer 104 is formed on the surface of the metal plate 102.

Here, a metal material which is relatively cheap and easily obtained and aluminum (Al) or aluminum alloy having very superior heat transfer characteristics may be used as the metal plate 102. Since the metal plate 102 has superior heat transfer characteristics, the metal plate 102 serves as a heat dissipating member.

For example, the anodized layer 104 is made by putting the metal plate 102 made of aluminum or aluminum alloy into an electrolyte such as boric acid, phosphoric acid, sulfuric acid, or chromic acid, applying the anode to the metal plate 102 and applying the cathode to the electrolyte. At this time, an aluminum anodized film ($Al_2O_3$) having the relatively high heat transfer characteristics of about 10 to 30 W/mK is formed on a surface of the metal plate 102. Since the anodized layer 104 has an insulating function, it is possible to form the circuit layer on the anodized layer 104. Further, the anodized layer 104 is formed to be thinner than a resin insulating layer and has high heat transfer characteristics, thus contributing to the thinness and heat dissipating performance of the heat-dissipating substrate.

Figure 13A:
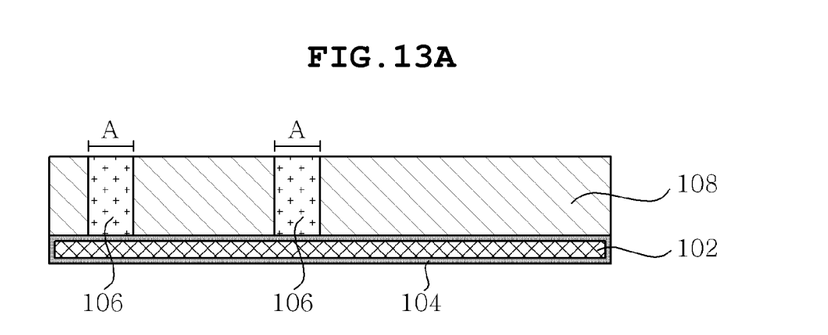
Figure 13B:
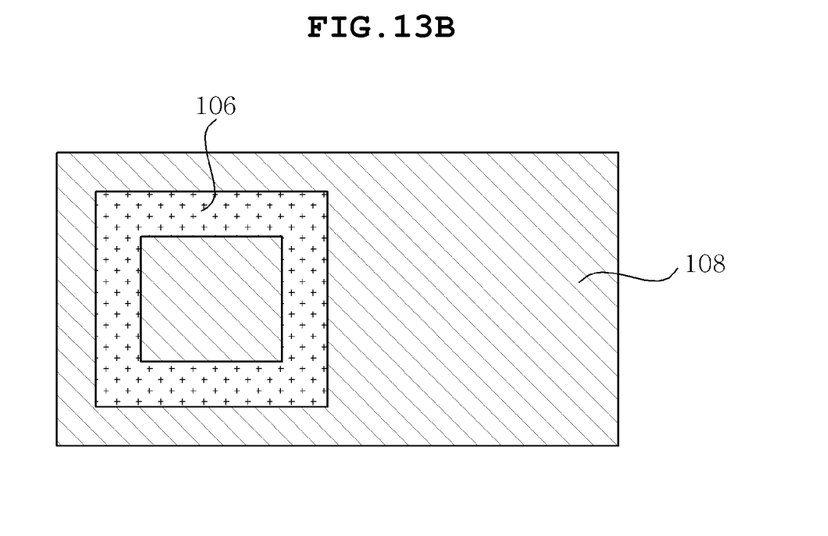

Next, as shown in FIGS. 13A and 13B, after a plating resist 106 is applied to a division area A on one surface of the metal plate 102 on which the anodized layer 104 is formed, the plating layer 108 is formed everywhere except for on the division area A. Here, the plating layer 108 is divided into an inner plating layer and an outer plating layer by the division area A. The plating resist 106 formed in the division area A thermally isolates the inner plating layer from the outer plating layer.

In detail, the plating resist 106 such as a dry film or a positive liquid photo resist (P-LPR) is applied to the anodized layer 104 which is formed on a surface of the metal plate 102. Subsequently, ultraviolet rays are exposed to a portion of the plating resist 106 other than the division area A, the exposed portion is removed using a developing solution, and the resist removed portion goes through an electroless plating process or an electrolytic plating process, thus forming the plating layer 108.

Figure 14A:
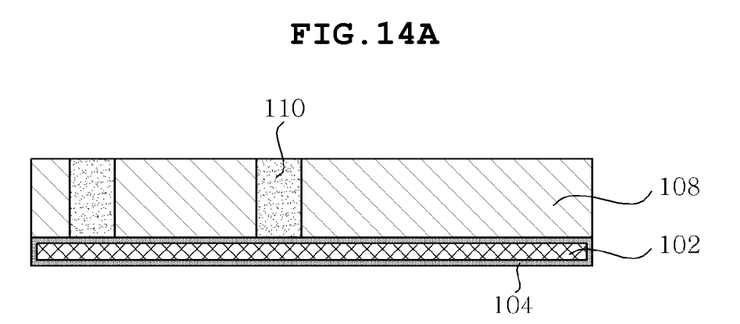
Figure 14B:
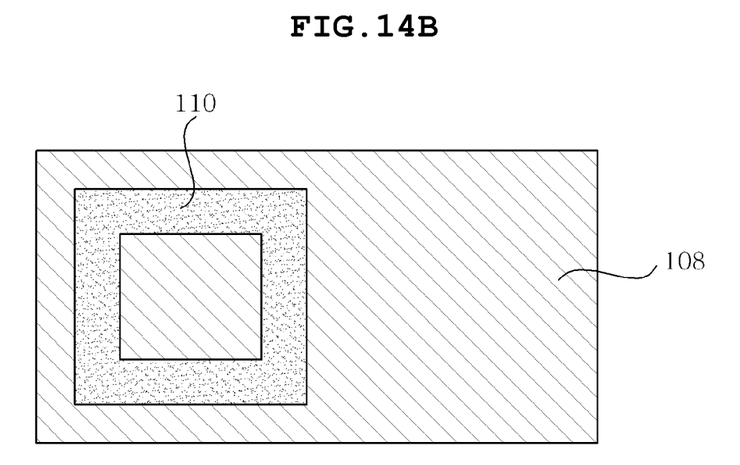

Next, as shown in FIGS. 14A and 14B, the plating resist 106 is removed from the division area A, and the division area A is filled with the first insulator 110 having low heat conductivity.

Here, the plating resist 106 is removed using a stripper such as sodium hydroxide (NaOH) or potassium hydroxide (KOH).

Meanwhile, if the heat conductivity of the plating resist 106 is low, it may substitute for the first insulator 110. Thus, this process may be omitted.

Figure 15A:
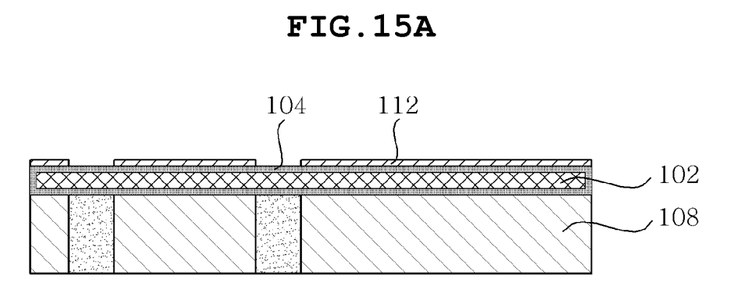
Figure 15B:
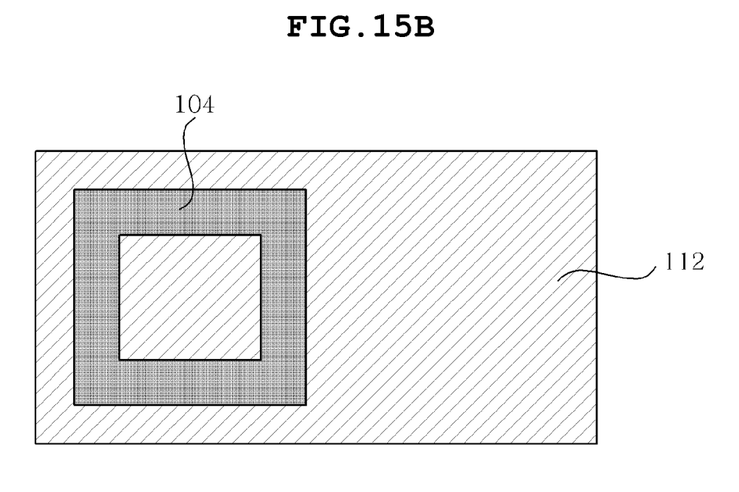

Next, as shown in FIGS. 15A and 15B, the circuit layer 112 is formed on the anodized layer 104 which is formed on the other surface of the metal plate 102.

The circuit layer 112 is formed by forming the plating layer using an electroless plating process or an electrolytic plating process, and patterning the plating layer.

Preferably, the circuit layer 112 is not formed on the division area A filled with the second insulator 114 for thermal isolation.

Figure 16A:
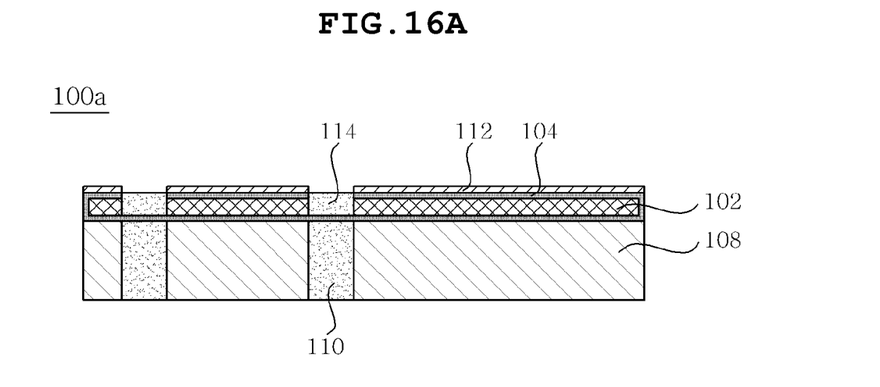
Figure 16B:
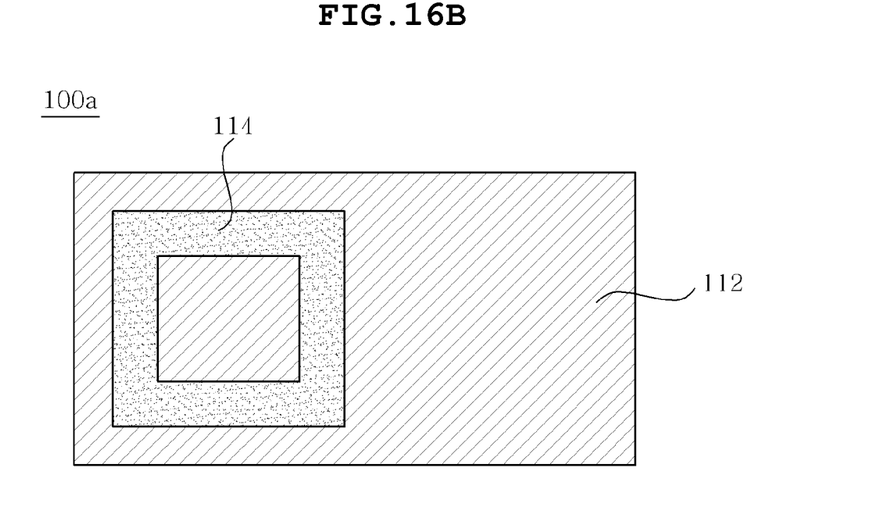

Finally, as shown in FIGS. 16A and 16B, the anodized layer 104 and the metal plate 102 of the division area A are removed, and a removed portion is filled with the second insulator 114.

The anodized layer 104 may be removed by laser beam, and the metal plate 102 may be removed through an etching process.

In this step of the process, the metal plate 102 of the division area A and the anodized layer 104 formed on the upper surface of the metal plate 102 are removed.

Through the fabrication process, the heat-dissipating substrate 100a of FIG. 7 is obtained.

Hereinbefore, the fabricating method of the heat-dissipating substrate according to the first embodiment of the present invention has been described. However, it is apparent that the heat-dissipating substrates according to the second to fifth embodiments may be fabricated through the above-mentioned method, and so this falls within the scope of the present invention.

As described above, the present invention provides a heat-dissipating substrate and a fabricating method thereof, in which the division area of an anodized metal substrate is filled with an insulator to form a thermal isolation structure, thus permitting thermal isolation when a device resistant to heat and a device susceptible to heat are simultaneously mounted.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

Accordingly, such modifications, additions and substitutions should also be understood as falling within the scope of the present invention.

What is claimed is:

1. A heat-dissipating substrate, comprising:
   a plating layer divided into a closed region and an outside region by a first insulator formed in a division area;
   a metal plate formed on an upper surface of the plating layer and filled with a second insulator at a position corresponding to the division area, with an anodized layer formed on a surface of the metal plate; and
   a circuit layer formed on the anodized layer which is formed on an upper surface of the metal plate;
   wherein, the closed region is surrounded by the first and second insulators and is substantially thermally isolated from the outside of the first and second insulators.

2. The heat-dissipating substrate as set forth in claim 1, wherein the anodized layer is formed on a lower surface of the metal plate and is provided at an interface of the first insulator and the second insulator, and is in direct contact with them.

3. The heat-dissipating substrate as set forth in claim 1, wherein the first insulator and the second insulator are formed to contact each other.

4. The heat-dissipating substrate as set forth in claim 1, wherein the metal plate is made of aluminum or aluminum alloy, and the anodized layer comprises an aluminum anodized layer.

5. The heat-dissipating substrate as set forth in claim 1, wherein a groove is formed in the plating layer.

6. The heat-dissipating substrate as set forth in claim 1, wherein the plating layer forms an open part therein to have a circuit pattern, and the circuit pattern is electrically connected to the circuit layer through a via hole which is formed through the metal plate.

7. The heat-dissipating substrate as set forth in claim 6, wherein a through hole is formed in the metal plate, and the anodized layer is formed on the metal plate including an inner wall of the through hole, and the via hole is formed in the through hole to be connected to the circuit layer.

8. The heat-dissipating substrate as set forth in claim 6, wherein the open part is filled with a third insulator.

9. A heat-dissipating substrate, comprising:
   a plating layer divided into a closed region and an outside region by a first insulator formed in a division area;
   a metal plate formed on an upper surface of the plating layer and filled with a second insulator at a position corresponding to the division area, with an anodized layer formed on a surface of the metal plate; and
   a circuit layer formed on the anodized layer which is formed on an upper surface of the metal plate,
   wherein, the closed region surrounded by the first and second insulators are thermally isolated from the outside of the first and second insulators,
   wherein the anodized layer formed on a lower surface of the metal plate is provided at the interface of the first insulator and second insulator, and comes in direct contact with them.

* * * * *